US 9,152,053 B2

(12) United States Patent
Hattori et al.

(10) Patent No.: US 9,152,053 B2
(45) Date of Patent: Oct. 6, 2015

(54) METHOD OF FORMING PATTERN (75) Inventors: Shigeki Hattori, Kawasaki (JP); Ryota Kitagawa, Fuchu (JP); Koji Asakawa, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 724 days.

(21) Appl. No.: 13/429,901

(22) Filed: Mar. 26, 2012

(65) Prior Publication Data
US 2012/0238109 A1  Sep. 20, 2012

Related U.S. Application Data

(63) Continuation of application No. PCT/JP2009/066828, filed on Sep. 28, 2009.

(51) Int. Cl.
| | |
|---|---|
| G03F 7/16 | (2006.01) |
| G03F 7/004 | (2006.01) |
| G03F 7/075 | (2006.01) |
| G03F 7/26 | (2006.01) |
| H01L 21/033 | (2006.01) |
| H01L 21/306 | (2006.01) |

(Continued)

(52) U.S. Cl.
CPC ............ *G03F 7/165* (2013.01); *B81C 1/00031* (2013.01); *G03F 7/0046* (2013.01); *G03F 7/0755* (2013.01); *G03F 7/265* (2013.01); *H01L 21/0337* (2013.01); *H01L 21/306* (2013.01); *B05D 1/185* (2013.01); *B81C 2201/0149* (2013.01)

(58) Field of Classification Search
CPC ..... G03F 7/0046; G03F 7/0755; G03F 7/165; G03F 7/265; G08J 7/123; B81C 1/00031; B81C 2201/0149; H01L 21/0337; H01L 21/306; B05D 1/185
USPC .................................................. 427/504, 510
See application file for complete search history.

(56) References Cited

U.S. PATENT DOCUMENTS

| | | | |
|---|---|---|---|
| 6,565,763 B1 | 5/2003 | Asakawa et al. | |
| 7,090,784 B2 | 8/2006 | Asakawa et al. | |
| 7,097,781 B2 | 8/2006 | Asakawa et al. | |

(Continued)

FOREIGN PATENT DOCUMENTS

| | | | |
|---|---|---|---|
| JP | 6-202343 A | 7/1994 | |
| JP | 2003-321479 A | 11/2003 | |

(Continued)

OTHER PUBLICATIONS

U.S. Appl. No. 13/626,415, filed Sep. 25, 2012, Hieno, et al.

(Continued)

*Primary Examiner* — Elena T Lightfoot
(74) *Attorney, Agent, or Firm* — Oblon, McClelland, Maier & Neustadt, L.L.P.

(57) ABSTRACT

According to one embodiment, a method of forming a pattern includes forming a monolayer on a substrate, selectively exposing the monolayer to an energy beam and selectively modifying exposed portions thereof to form patterns of exposed and unexposed portions, forming a block copolymer layer includes first and second block chains on the monolayer, and causing the block copolymer layer to be phase-separated to form patterns of the first and second block chains of the block copolymer layer based on the patterns of the exposed and unexposed portions of the monolayer.

4 Claims, 3 Drawing Sheets

(51) Int. Cl.
  *B81C 1/00* (2006.01)
  *B05D 1/18* (2006.01)

(56) References Cited

U.S. PATENT DOCUMENTS

| | | | |
|---|---|---|---|
| 7,517,466 | B2 | 4/2009 | Asakawa et al. |
| 7,901,866 | B2 * | 3/2011 | Ito .................... 430/270.1 |
| 7,931,819 | B2 | 4/2011 | Kihara et al. |
| 8,043,520 | B2 | 10/2011 | Asakawa et al. |
| 2012/0037594 | A1 | 2/2012 | Asakawa et al. |
| 2012/0037595 | A1 | 2/2012 | Asakawa et al. |
| 2012/0041121 | A1 | 2/2012 | Asakawa et al. |

FOREIGN PATENT DOCUMENTS

| | | | |
|---|---|---|---|
| JP | 2005-502917 | A | 1/2005 |
| JP | 2008-43873 | | 2/2008 |
| JP | 2008-43873 | A | 2/2008 |
| JP | 2008-96596 | | 4/2008 |
| JP | 2008-96596 | A | 4/2008 |
| JP | 2009-292703 | A | 12/2009 |
| JP | 2010-152013 | A | 7/2010 |
| WO | WO 2008047817 | A1 * | 4/2008 |

OTHER PUBLICATIONS

English translation of the International Preliminary Report on Patentability issued Apr. 19, 2012 in PCT/JP2009/066828 filed Sep. 28, 2009.

English translation of the Written Opinion of the International Searching Authority issued Oct. 27, 2009 in PCT/JP2009/066828 filed Sep. 28, 2009.

Office Action issued Jul. 3, 2012, in Japanese Patent Application No. 2011-532890 with English translation.

International Search Report issued Oct. 27, 2009 in PCT/JP2009/066828 filed Sep. 28, 2009.

Joy Y. Cheng, et al.; "Dense Self-Assembly on Sparse Chemical Patterns: Rectifying and Multiplying Lithographic Patterns Using Block Copolymers"; Advanced Materials, 2008, vol. 20, pp. 3155-3158.

Sang Ouk Kim, et al.; "Epitaxial self-assembly of block copolymers on lithographically defined nanopatterned substrates"; Nature, 2003, vol. 424, No. 24, pp. 411-414.

Ricardo Ruiz, et al.; "Density Multiplication and Improved Lithography by Directed Block Copolymer Assembly"; Science, 2008, vol. 321, pp. 936-939.

* cited by examiner

F I G. 1A

F I G. 1B

F I G. 2

F I G. 3

F I G. 4

F I G. 5

9,152,053 B2

METHOD OF FORMING PATTERN

CROSS-REFERENCE TO RELATED APPLICATIONS

This application is a Continuation Application of PCT Application No. PCT/JP2009/066828, filed Sep. 28, 2009, the entire contents of which are incorporated herein by reference.

FIELD

Embodiments described herein relate generally to a method of forming a pattern applicable to, for example, microfabrication of semiconductor devices.

BACKGROUND

Conventionally, microfabrication techniques based on lithography are employed in manufacturing processes of semiconductor devices such as LSI. In the future, a much finer processing is certainly required. Accordingly, shortening the wavelength of a light source in lithography and enhancing performance of a resist are proceeding. However, it is becoming difficult to improve resolution by these measures.

On the other hand, a microfabrication technique using a phase-separated structure of a block copolymer attracts attention. In this microfabrication technique, it is required to regularly arrange the phase-separated structure of the block copolymer. In order to regularly arrange the phase-separated structure of the block copolymer, following methods are proposed.

For example, known is a method comprising: forming a self-assembled monolayer (SAM) on a substrate; applying a resist thereto followed by forming line-and-space resist patterns by lithography; selectively irradiating the SAM with X-rays in an oxygen atmosphere using the resist patterns as masks to chemically modify a part of the SAM; removing the resist patterns; and applying a block copolymer to the SAM followed by annealing to form microdomain patterns of the block copolymer.

Also, known is a method comprising: forming an SAM on a substrate; selectively exposing a part of the SAM by interference exposure with two or more beams to form chemically modified dot patterns; and applying a block copolymer to the SAM followed by annealing to form contact hole patterns through phase separation of the block copolymer.

Furthermore, known is a method comprising: forming an SAM on a substrate; applying an electron beam resist thereto followed by forming dot patterns by lithography; irradiating the SAM with oxygen plasma using dot patterns of the electron beam resist as masks to chemically modify a part of the SAM; removing the resist patterns; and applying a block copolymer to the SAM followed by annealing to form microdomain patterns of the block copolymer. In this method, it is disclosed that a dot pitch of the dot patterns of the block copolymer may be narrower than that of the dot patterns formed in the electron beam resist.

However, these methods require many steps to align the orientation of the microdomain patterns of the block copolymer and thus they are impractical for the microfabrication techniques for semiconductor devices.

DETAILED DESCRIPTION

In general, according to one embodiment, a method of forming a pattern includes forming a monolayer on a substrate, selectively exposing the monolayer to an energy beam and selectively modifying exposed portions thereof to form patterns of exposed and unexposed portions, forming a block copolymer layer comprising first and second block chains on the monolayer, and causing the block copolymer layer to be phase-separated to form microdomain patterns of the first and second block chains of the block copolymer layer based on the patterns of the exposed and unexposed portions of the monolayer.

Hereinafter, embodiments will be described.

In the embodiments, any substrate used for semiconductor devices can be used. Examples of the substrates include silicon wafers, doped silicon wafers, silicon wafers in which an insulating layer or a metal layer used as an electrode or a wiring is formed on a surface thereof; mask blanks; and III-V compound semiconductor wafers such as GaAs and AlGaAs. Other examples of the substrates include chromium or chromium oxide deposited substrate, an aluminium deposited substrate, a substrate with a passivation oxide film such as a phosphosilicate glass (PSG) coating, a spin-on glass (SOG) coated substrate, and a SiN-coated substrate.

It is preferable that the substrate used in the embodiments is, for example, one having many hydroxy groups on a surface thereof from the viewpoint of easiness of forming the self-assembled monolayer (SAM) to be described later. In order to remove organic impurities adhered to the surface of the substrate, it is preferable to perform a pretreatment such as UV irradiation to the substrate.

In the embodiments, the monolayer formed on the substrate is preferably one which is referred to self-assembly monolayer (SAM).

Taking the assumption of fabricating semiconductor devices into consideration, a material constituting the monolayer is preferably one which easily reacts with a hydroxy group on a surface of metal and metal oxide formed on a silicon substrate. Such a monolayer forming material includes a silane coupling reagent. It is preferable that the silane coupling reagent efficiently absorbs an energy beam so that the exposed portion is modified when exposed to an energy beam such as an ultraviolet ray and an electron beam. Examples of the silane coupling reagent that efficiently absorbs the energy beam include a silane coupling reagent having an organic group composed of one or more benzene rings and a silane coupling reagent having an organic group comprising a halogen group. Hereinafter, suitable silane coupling reagents used in the embodiments will be described.

The silane coupling reagent having an organic group composed of one or more benzene rings is represented by the following Formula Ia:

(Formula Ia)

where $R_1$ groups are selected from hydrogen, an alkyl group and a halogen group which may be identical or different; $R_2$ group is an organic group having one or more benzene rings. Examples of the alkyl group include a methyl group, an ethyl group, and a propyl group. Examples of the halogen group include Cl (chlorine) and F (fluorine).

Since the silane coupling reagent represented by the Formula Ia, formed as a self-assembly monolayer (SAM) on a substrate, contains a benzene ring, it efficiently absorbs energy beam to be modified through a chemical reaction which brings about change in surface energy. As a result, patterns of exposed and unexposed portions are formed by irradiation of the monolayer with the energy beam.

It is preferable for the silane coupling reagent represented by the Formula Ia that the benzene ring contained in the organic group $R_2$ has a halogenated methyl group such as a chloromethyl group and a fluoromethyl group on the para position. Such a silane coupling reagent is represented by the following Formula Ib:

(Formula Ib)

where $R_1$ groups are selected from hydrogen, an alkyl group and a halogen group which may be identical or different; $R_3$ is a single bond or an alkyl group; $R_4$ groups are selected from hydrogen, an alkyl group, a halogen group, and a halogenated methyl group which may be identical or different; and X is a halogen group. Examples of the alkyl group include a methyl group, an ethyl group, and a propyl group. Examples of the halogen of the halogen group or the halogenated methyl group include Cl (chlorine) and F (fluorine).

The silane coupling reagent represented by the Formula Ib efficiently absorbs an energy beam and is easily subjected to functional group transformation, leading to improved sensitivity. That is, in the silane coupling reagent represented by Formula Ia which has no halogenated methyl group, the energy beam absorbed by the benzene ring causes cleavage of the single bond between Si and $R_2$ which leads to transformation into a hydroxy group through a reaction with a small amount of moisture in the air. In the silane coupling reagent represented by Formula Ib having a halogenated methyl group, the energy beam absorbed by the benzene ring causes cleavage of the single bond between halogen and methyl of the halogenated methyl group which leads to transformation into an aldehyde group through a reaction with a small amount of moisture in the air. When both reactions are compared, the bond between halogen and C (carbon) is weaker and more easily cleaved than the bond between Si and C (carbon), and thus the sensitivity is improved.

In a silane coupling reagent represented by the Formula Ib, $R_3$ is preferably a single bond or a linear alkyl group. Such a silane coupling reagent is represented by the following Formula Ic:

(Formula IC)

where $R_1$ groups are selected from hydrogen, an alkyl group and a halogen group which may be identical or different; $R_4$ groups are selected from hydrogen, an alkyl group, a halogen group and a halogenated methyl group which may be identical or different; X is a halogen group; and n is an integer of 0 to 20. Examples of the alkyl group include a methyl group, an ethyl group, and a propyl group. Examples of the halogen of the halogen group or the halogenated methyl group include Cl (chlorine) and F (fluorine).

Since the silane coupling reagent represented by the Formula Ic chemically is chemically bonded with a functional group on the surface of the substrate and further forms an intermolecular bond between the silane coupling reagents themselves, a high-density SAM is easily formed.

Further, it is preferable for the silane coupling reagent represented by Formula Ic that $R_1$ groups are selected from chlorine, a methyl group, an ethyl group and an n-propyl group; $R_4$ groups are hydrogen; and X is F (fluorine) or Cl (chlorine). Such a silane coupling reagent is represented by the following Formula Id:

(Formula Id)

where $R_1$ groups are selected from chlorine, a methyl group, an ethyl group and an n-propyl group; X is F (fluorine) or Cl (chlorine); and n is an integer of 0 to 20.

The silane coupling reagent represented by Formula Id is preferred from the viewpoint of simple synthesis and reduction in cost.

The silane coupling reagent having an organic group comprising a halogen group is represented the following Formula IIa:

(Formula IIa)

where $R_5$ groups are selected from hydrogen, an alkyl group and a halogen group which may be identical or different; and $R_6$ is an organic group comprising a halogen group. Examples of the alkyl group include a methyl group, an ethyl group, and a propyl group. Examples of the halogen group include Cl (chlorine) and F (fluorine).

Since the silane coupling reagent represented by the Formula IIa, formed as a self-assembly monolayer (SAM) on a substrate, contains an organic group comprising a halogen group, it efficiently absorbs energy beam to be modified through a chemical reaction which brings about change in surface energy. As a result, patterns of exposed and unexposed portions are formed by irradiation of the monolayer with energy beam.

It is preferable for the silane coupling reagent represented by Formula IIa the organic group $R_6$ is an alkyl group comprising many halogen groups. Such a silane coupling agent is represented by following Formula Ib:

(Formula IIb)

where $R_5$ groups are selected from hydrogen, an alkyl group and a halogen group which may be identical or different; Y is a halogen group; and m and l are integers of 0 to 20. Examples of the alkyl group include a methyl group, an ethyl group, and a propyl group. Examples of the halogen group include Cl (chlorine) and F (fluorine).

The silane coupling reagent represented by the Formula IIb efficiently absorbs an energy beam and is easily subjected to functional group transformation, leading to improved sensitivity. That is, in the silane coupling reagent represented by the Formula IIb, the absorbed energy beam causes cleavage of the single bond between Si and C (carbon) which leads to transformation into a hydroxy group through a reaction with a small amount of moisture in the air.

As a process of forming a monolayer, spin coating, dip coating, and vapor-phase deposition can be used.

The spin coating process comprises spin-coating a monolayer forming material diluted with a solvent or as a stock solution on a substrate, performing baking on a hot plate, if necessary, and rinsing an excessive amount of the monolayer forming material adsorbed to form a monolayer.

The dip coating process comprises diluting a monolayer forming material with a solvent, and immersing a substrate in the diluted solution for a given period of time to form a monolayer.

The vapor-phase deposition comprises allowing a monolayer forming material to be in a gaseous state by reducing ambient pressure, or raising temperature or both, introducing a substrate thereinto, and exposing the substrate to the gaseous monolayer-forming-material for a given period of time to form a monolayer on a surface of the substrate.

In the spin coating, the concentration for diluting the monolayer forming material with a solvent is preferably from 1 to 30 wt %, but it is not particularly limited thereto. It is preferable to adjust the concentration depending on a level of the spread of the material on the substrate. Although the solvent to be used varies depending on the monolayer forming material, a solvent that does not cause reaction with the monolayer forming material is preferred. Examples of the solvent include aromatic hydrocarbons such as toluene, xylene, and mesitylene; cycloalkanes such as cyclohexane, cycloheptane, cyclooctane, and cyclononane; alkanes such as hexane, heptane, octane, nonane, and decane; and alkyl alcohols such as methanol, ethanol, 1-propanol, and 2-propanol. In addition to the above solvents, from the viewpoint of reactivity, wettability with the substrate, and volatility, examples thereof include organic solvents such as ketones, cellosolves and esters to be used for a general solvent for photoresists. Examples of the ketones include cyclohexanone, acetone, ethyl methyl ketone, and methyl isobutyl ketone. Examples of the cellosolves include methyl cellosolve, methyl cellosolve acetate, ethyl cellosolve acetate, and butyl cellosolve acetate. Examples of the esters include ethyl acetate, butyl acetate, isoamyl acetate, γ-butyrolactone, and 3-methoxy methyl propionate. The solvents can be used in combination with two or more, if necessary. From the viewpoint of reactivity with the functional group on the surface of the substrate, it is preferable to use a dehydrated solvent. The temperature of baking on the hot plate is preferably from 100 to 200° C. from the viewpoint of exceeding activation energy for forming a chemical bond between the monolayer forming material and a functional group on the surface of the substrate. As the solvent to be used when rinsing an excessive amount of the monolayer-forming material adsorbed to a multilayer over the monolayer, it is preferable to use the solvent which is the same as that used when diluting the monolayer forming material.

In the dip coating, the concentration for diluting a monolayer-forming material with a solvent is preferably from 1 to 30 wt %. The solvent to be used is preferably a solvent that does not cause reaction with the monolayer-forming material, similarly to the solvent to be used in the spin coating. Examples of the solvent include aromatic hydrocarbons such as toluene, xylene, and mesitylene; cycloalkanes such as cyclohexane, cycloheptane, cyclooctane, and cyclononane; alkanes such as hexane, heptane, octane, nonane, and decane; and alkyl alcohols such as methanol, ethanol, 1-propanol, and 2-propanol. From the viewpoint of reactivity with the functional group on the surface of the substrate, it is preferable to use a dehydrated solvent. Although the immersion time is dependent on the concentration and reactivity, it is preferably from 1 to 60 minutes. From the viewpoint of the reaction rate, the substrate may be immersed in a heated solution. The immersion temperature is set to a temperature that is less than a boiling point of the solvent and does not allow the monolayer-forming material to be decomposed before the monolayer-forming material reacts with the functional group on the surface of the substrate. Generally, it is adjusted to 40 to 100° C. As the solvent to be used when rinsing an excessive amount of the monolayer-forming material adsorbed over the monolayer, it is preferable to use the solvent which is the same as that used for the immersion. It is preferable that the solvent is removed by blowing of an inert gas such as nitrogen and argon after the rinsing or the solvent is removed by heating it on a hot plate in a certain case.

In the vapor-phase deposition, in order to allow the monolayer-forming material to be in a gaseous state, the ambient pressure is reduced or the temperature is raised or both are performed depending on vapor pressure characteristics of the material. Although the temperature is dependent on the boiling point of the monolayer-forming material to be used, it is preferable that the ambient pressure is reduced and the temperature is raised until the material is changed to the gaseous state from the viewpoint of the stability of the material. It is preferable that a substrate is placed in a space where the monolayer-forming material in a gaseous state is present or is placed therein in advance and then the surface of the substrate is exposed for 1 to 5 hours. After the exposure of the substrate, an excessive amount of the monolayer-forming material adsorbed over the monolayer may be rinsed with a solvent, if necessary. The solvent to be used is preferably the solvent that is described regarding the spin coating.

The energy beam to be used for exposure of the monolayer is not particularly limited as long as it has a wavelength with which the monolayer-forming material senses. Specific examples thereof include ultraviolet rays, i-line, h-line or g-line of a mercury lamp; xenon lamp light, new ultraviolet light (e.g., excimer laser light such as KrF or ArF); X-rays, synchrotron orbital radiation (SR), an electron beam, γ-rays, and an ion beam.

When the monolayer is selectively exposed to the energy beam, the exposed portions are selectively modified to form patterns of exposed and unexposed portions. The term "modification of the exposed portion" herein means that the single bond of the monolayer forming material such as a silane coupling agent is cleaved and the particular portions are transformed into hydroxy groups through reaction with a small amount of moisture in the air. When formation of a circuit pattern of a semiconductor device is assumed, there is conceived a process of forming line-and-space patterns of exposed and unexposed portions by selectively exposing the monolayer to the energy beam.

Figure 1A:
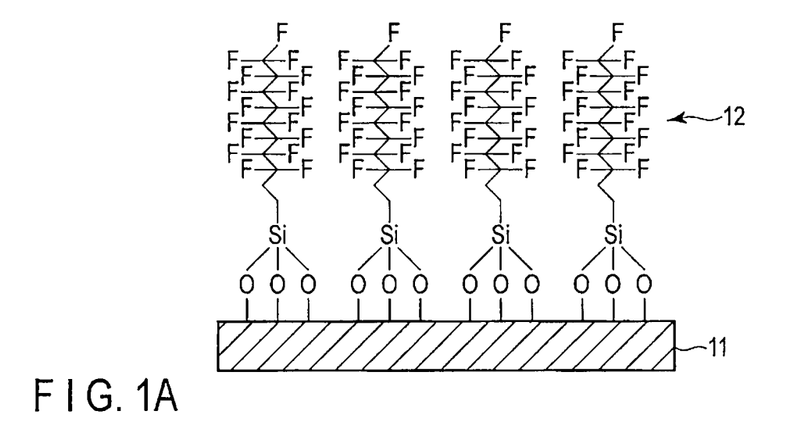
FIGS. 1A and 1B are schematic views illustrating modification of a monolayer in Examples.
Figure 1B:
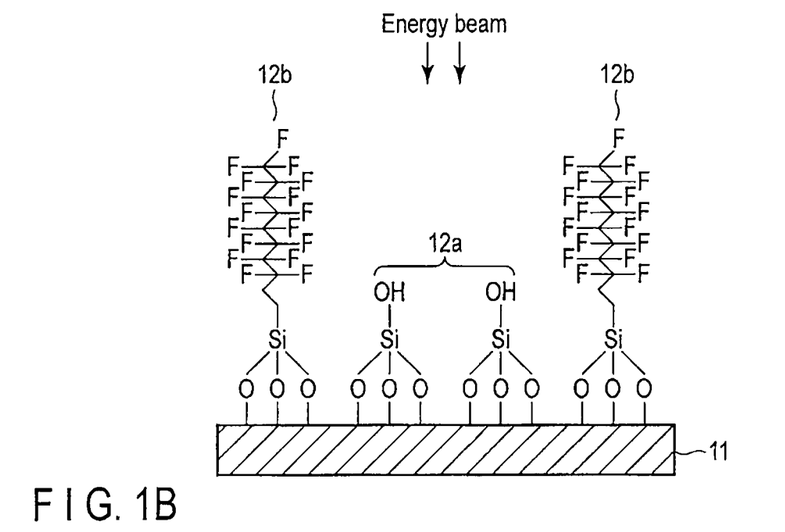

The modification of a monolayer will be described with reference to FIGS. 1A and 1B. As shown in FIG. 1A, a monolayer 12 of a silane coupling reagent is formed on a silicon substrate 11. As shown in FIG. 1B, the monolayer 12 is selectively exposed to an energy beam to be modified in an exposed portion 12a selectively by which patterns of the exposed portion 12a and an unexposed portion 12b are formed. A hydroxy group is produced in the exposed portion 12a.

As for the block copolymer to be used in the embodiments, one of the block chains can be removed by some methods in such a manner that the first and second block chains have different reactive ion etching (RIE) resistance. For example, when the block copolymer of polystyrene and polybutadiene is used, only the polystyrene block can be left by ozone treatment. When the block copolymer of polystyrene and polymethylmethacrylate is used, only the polystyrene block can be left by RIE using a reactive gas such as $O_2$ and $CF_4$.

A method of applying a block copolymer to the monolayer formed on the substrate is not particularly limited. For example, spin coating, dip coating, a doctor blade, curtain coating, and other method are used. After applying a block copolymer solution, the monolayer may be heated on a hot plate to remove the solvent, if necessary. The heating temperature at this time is preferably from 70 to 120° C.

In order to cause the block copolymer to be phase-separated, the annealing is generally performed at a temperature above the glass transition temperature of the block copolymer. It is known that the phase separation rate of the block copolymer has a correlation with the annealing temperature. When the annealing temperature becomes higher than an order-disorder transition temperature (ODT), the block copolymer has a disordered structure and the phase-separated structure is not obtained. Thus, it is preferable that the annealing is performed at a moderate temperature for giving a moderate phase separation rate. Although the annealing temperature varies depending on the molecular weight and the type of the block copolymer, the annealing temperature is preferably from 130 to 280° C. The annealing is performed using an oven or a hot plate. When the oven is used, the annealing is performed at a low temperature for a long period of time. When the hot plate is used, the annealing is performed at a high temperature for a short period of time.

When the annealing is performed in an atmosphere where a small amount of reactive gas such as oxygen is present, a high annealing temperature may cause decomposition of the block copolymer. From the viewpoint of preventing the decomposition of the block copolymer, the annealing is performed, preferably in an inert gas atmosphere of argon or nitrogen. The annealing may be performed in a foaming gas atmosphere comprising about 3% of hydrogen, if necessary.

The block copolymer to be used in the embodiments has preferably a composition that the first and second block chains form a lamellar structure when it is phase-separated. In this case, when the block copolymer is phase-separated, and one of the first and second block chains is removed and the other is left, line-and-space patterns can be formed.

Additionally, it is found that when the monolayer is selectively exposed to an energy beam and is selectively modified in the exposed portions by which line-and-space patterns of exposed and unexposed portions are formed and a block copolymer layer is formed on the line-and-space patterns and then the block copolymer layer is phase-separated, the width of the line-and-space patterns of the first and second block chains of the block copolymer layer may be narrower than that of the line-and-space patterns of the exposed and unexposed portions of the monolayer. This is considered because the silane coupling reagent in the exposed portion becomes hydrophilic, while the silane coupling reagent in the unexposed portion remains in a highly hydrophobic state without any reaction and is in a highly water-repellent surface state that repels various substances, and thus the applied block copolymer is repelled by high water repellence and the copolymer tends to move to the hydrophilic exposed portion, resulting in reduction of the pattern size and pitch.

Therefore, when an underlayer, namely, a substrate itself or a metal or insulating layer formed on the substrate is etched using the left patterns as masks, finer line-and-space patterns which exceed the resolution of the energy beam used for exposure of the monolayer.

EXAMPLES

Hereinafter, embodiments will be described with reference to Examples.

Examples 1 to 3

Examples will be described where a monolayer of a silane coupling reagent is formed on a silicon wafer, line-and-space patterns are formed by electron beam lithography, and further line-and-space patterns of block copolymer are formed.

As a silane coupling reagent, 1H,1H,2H,2H-perfluorodecyltriethoxysilane (FDS) was used. Since FDS contains many fluorine atoms, it efficiently absorbs high energy beam such as an electron beam and X-rays.

A surface of the silicon wafer was treated with an ultraviolet cleaner for 5 minutes. The silicon wafer was put into a chamber. The chamber was decompressed, FDS was introduced thereto which was heated to 110° C. and the silicon wafer was exposed to the atmosphere of FDS for 3 hours.

It was confirmed that a self-assembly monolayer (SAM) of FDS was formed on the silicon wafer by measuring a contact angle of waterdrop in the following manner. A waterdrop with a diameter of 1.4 mm was dropped on the substrate and the contact angle was measured after 30 seconds. The contact angle was 6° before the process, but it became 80.5° after the process. The fact that the contact angle of the waterdrop becomes large means that the surface energy of the substrate is lowered, namely, it is hydrophobized. Therefore, it can be considered that the SAM of FDS was formed.

Subsequently, a part of the SAM of FDS was selectively irradiated with electron beams using an electron beam lithography system at an accelerating voltage of 30 keV and a dose of 700 μC/cm$^2$ and line-and-space patterns are drawn. When a waterdrop was dropped on the area irradiated with electron beams and the contact angle was measured, the angle was 10.0°. Accordingly, it can be considered that the FDS present at the area irradiated with electron beams was reacted with moisture in air to form a hydroxy terminal, leading to hydrophilic properties. The line width and space width of the patterns are shown in Table 1.

TABLE 1

|  | line width (nm) | space width (nm) |
|---|---|---|
| Example 1 | 50 | 50 |
| Example 2 | 50 | 150 |
| Example 3 | 100 | 100 |

Separately, a solution of block copolymer was prepared. As the block copolymer, used were P2813-SMMA and P3964-SMMA available from Polymer Source, Inc., which were block copolymers (PS-b-PMMA) of polystyrene (PS) and polymethylmethacrylate (PMMA).

For P2813-SMMA, the number average molecular weights (Mn) of PS block and PMMA block are 130,000 and 133,000, respectively, and a degree of dispersion (Mw/Mn) is 1.1.

For P3964-SMMA, the Mns of PS block and PMMA block are 21,000 and 21,000, respectively, and the Mw/Mn is 1.07.

The toluene solution of the block copolymer was filtered through a 0.2-μm membrane filter. The resultant solution was applied to the monolayer and baked on a hot plate at 110° C. for 90 seconds to form a block copolymer layer. The concentration of the block copolymer solution, the spin speed during coating, and the thickness of the block copolymer layer are shown in Table 2.

TABLE 2

|  | Block copolymer | Concentration (wt %) | Spin speed (rpm) | Thickness (nm) |
|---|---|---|---|---|
| Example 1 | P2813-SMMA | 3.0 | 2000 | 150 |
| Example 2 | P2813-SMMA | 3.0 | 2000 | 150 |
| Example 3 | P3964-SMMA | 1.5 | 3000 | 40 |

Then, the block copolymer was phase-separated by annealing in an oven in a nitrogen atmosphere at 180° C. for 10 hours. A region of 500 nm by 500 nm (500 nm□) on each sample surface was measured in a tapping mode using an atomic force microscope (Nanoscope III) equipped with a super sharp silicon chip [SSS-NCH-50] as a cantilever. The orientation of each pattern was evaluated from the obtained phase image.

In any of Examples 1 to 3, the observed line-and-space patterns were parallel to the direction of electron beam drawing on the monolayer and there was no defect in the observed region.

Figure 2:
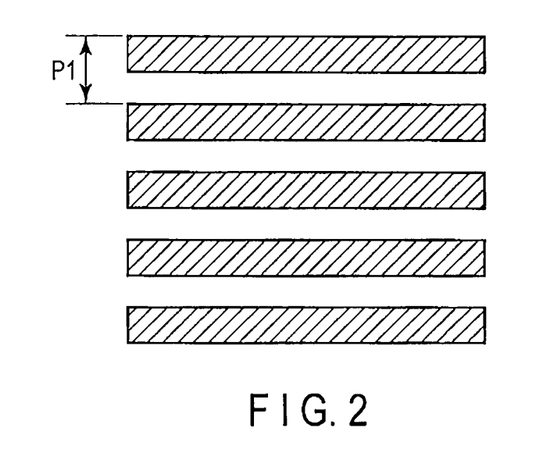
FIG. 2 is a plan view showing line-and-space patterns in Examples.
Figure 3:
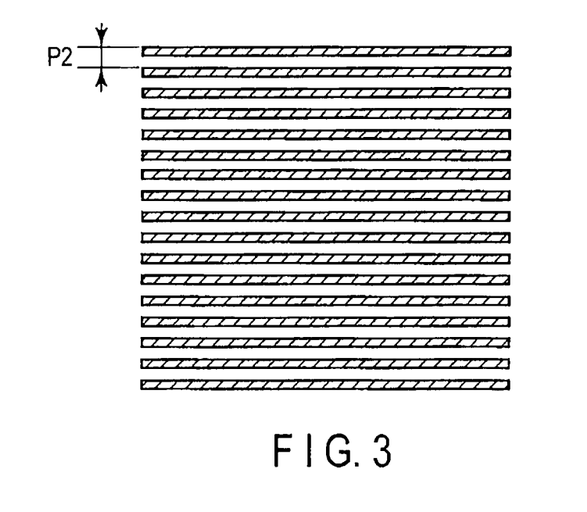
FIG. 3 is a plan view showing line-and-space patterns in Examples.

In Examples 1 and 2, it was observed that the line-and-space patterns were formed at a pitch P1 of about 100 nm as shown in FIG. 2. In Example 3, it was observed that the line-and-space patterns were formed at a pitch P2 of about 30 nm as shown in FIG. 3. A ratio of the observed line width to the space width in either FIG. 2 or 3 was about 1:1.

When the size of the electron beam drawing patterns on the monolayer is compared with the observed results, the followings are found. Namely, in Example 1, the size of the lamellae phase-separated patterns of the block copolymer is equal to the size of the electron beam drawing patterns on the monolayer. Further, in Examples 2 and 3, the size of the lamellae phase-separated patterns of the block copolymer is reduced as compared with the size of the electron beam drawing patterns on the monolayer. Thus, the size of the lamellae phase-separated patterns of block copolymer can be reduced as compared with the size of the electron beam drawing patterns on the monolayer.

The resultant sample was placed in an RIE system and etched under following conditions: a power of 50 W, an oxygen gas pressure of 1.0 Pa, and a flow rate of 50 sccm. Patterns of protrusions and recesses corresponding to the AFM image were observed with a scanning electron microscope (SEM). Thus, it was confirmed that the PMMA blocks were selectively etched and the PS blocks were left.

Examples 4 to 6

Examples will be described where a monolayer of a silane coupling agent is formed on a silicon wafer, line-and-space patterns are formed by irradiating the monolayer with ArF excimer laser, and further line-and-space patterns of block copolymer are formed.

As a silane coupling reagent, p-(chloromethyl)phenyltrimethoxysilane (CPS) was used. Since CPS has a chloromethyl phenyl group, it efficiently absorbs ultraviolet rays by which the chloromethyl group is transformed into an aldehyde group through a chemical reaction.

A surface of the silicon wafer was treated with an ultraviolet cleaner for 5 minutes. The silicon wafer was put into a chamber. The chamber was decompressed, CPS was introduced thereto which was heated to 150° C. and the silicon wafer was exposed to the atmosphere of CPS for 3 hours.

It was confirmed that a self-assembled monolayer (SAM) of CPS was formed on the silicon wafer by measuring a contact angle of waterdrop in the following manner. A waterdrop with a diameter of 1.4 mm was dropped on the substrate and the contact angle was measured after 30 seconds. The contact angle was 6° before the process, but it became 81.5° after the process. As a result, it can be considered that the SAM of CPS was formed.

Subsequently, using an ArF excimer laser stepper, a part of the SAM of CPS was selectively exposed to ArF excimer laser through a mask on with line-and-space patterns formed thereon at an exposure of 500 mJ/cm$^2$ to form line-and-space patterns. When a waterdrop was dropped on an area exposed to ArF excimer laser and the contact angle was measured, the angle was 7.0°. Accordingly, it can be considered that the CPS present at the area exposed to ArF excimer laser was reacted with moisture in air to form an aldehyde terminal, leading to hydrophilic properties. The line width and space width of the patterns are shown in Table 3.

TABLE 3

|  | line width (nm) | space width (nm) |
|---|---|---|
| Example 4 | 50 | 50 |
| Example 5 | 50 | 150 |
| Example 6 | 100 | 100 |

Separately, a solution of block copolymer was prepared. As described above, used were P2813-SMMA and P3964-SMMA available from Polymer Source, Inc., which were block copolymers (PS-b-PMMA) of polystyrene (PS) and polymethylmethacrylate (PMMA).

The toluene solution of block copolymer was filtered through a 0.2-μm membrane filter. The resultant solution was applied to the monolayer and baked on a hot plate at 110° C. for 90 seconds to form a block copolymer layer. The concentration of the block copolymer solution, the spin speed during coating, and the thickness of the block copolymer layer are shown in Table 4.

TABLE 4

| | Block copolymer | Concentration (wt %) | Spin speed (rpm) | Thickness (nm) |
|---|---|---|---|---|
| Example 4 | P2813-SMMA | 3.0 | 2000 | 150 |
| Example 5 | P2813-SMMA | 3.0 | 2000 | 150 |
| Example 6 | P3964-SMMA | 1.5 | 3000 | 40 |

Then, the block copolymer was phase-separated by annealing in an oven in a nitrogen atmosphere at 180° C. for 10 hours. A region of 500 nm by 500 nm (500 nm□) on each sample surface was measured in a tapping mode using an atomic force microscope (Nanoscope III) equipped with a super sharp silicon chip [SSS-NCH-50] as a cantilever. The orientation of each pattern was evaluated from the obtained phase image.

In any of Examples 4 to 6, the observed line-and-space patterns were parallel to the direction of the line-and-space patterns by ArF excimer laser exposure on the monolayer and there was no defect in the observed region.

Figure 4:
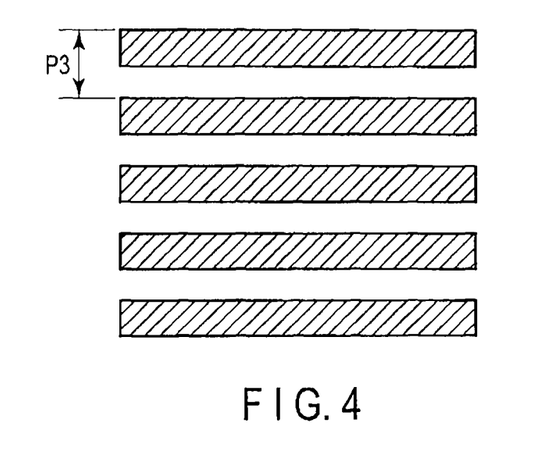
FIG. 4 is a plan view showing line-and-space patterns in Examples.
Figure 5:
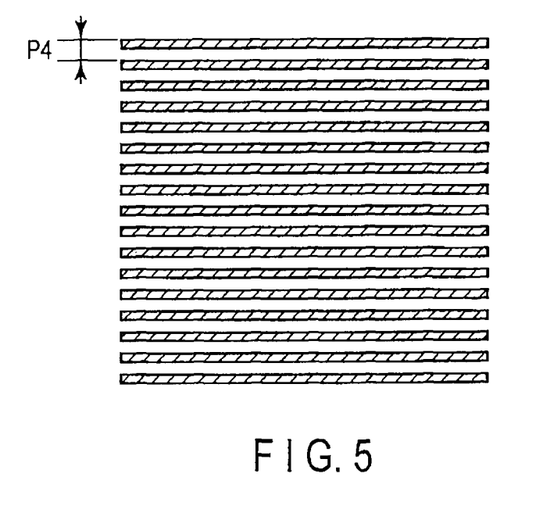
FIG. 5 is a plan view showing line-and-space patterns in Examples.

In Examples 4 and 5, it was observed that the line-and-space patterns were formed at a pitch P3 of about 100 nm as shown in FIG. 4. In Example 6, it was observed that the line-and-space patterns were formed at a pitch P4 of about 30 nm as shown in FIG. 5. A ratio of the observed line width to the space width in either FIG. 4 or 5 was about 1:1.

When the size of the exposure patterns by ArF excimer laser on the monolayer as shown in Table 3 is compared with the observed results, the followings are found. Namely, in Example 4, the size of the lamellae phase-separated patterns of the block copolymer is equal to the size of the exposure patterns on the monolayer. Further, in Examples 5 and 6, the size of the lamellae phase-separated patterns of the block copolymer is reduced as compared with the size of the exposure patterns by ArF excimer laser on the monolayer. Thus, the size of the lamellae phase-separated patterns of the block copolymer can be reduced as compared with the size of the exposure patterns by ArF excimer laser on the monolayer.

The resultant sample was placed in an RIE system and etched under following conditions: a power of 50 W, an oxygen gas pressure of 1.0 Pa, and a flow rate of 50 sccm. Patterns of protrusions and recesses corresponding to the AFM image were observed with a scanning electron microscope (SEM). Thus, it was confirmed that the PMMA blocks were selectively etched and the PS blocks were left.

The pattern forming method according to any of the embodiments makes it possible to form patterns equal to or finer than exposure patterns using a block copolymer, and thus, it is excellent microfabrication technique.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a pattern comprising:
   forming a layer of a silane coupling reagent on a substrate, the silane coupling reagent being represented by Formula II:

where each $R_5$ is independently selected from hydroxy, methoxy, ethoxy, propoxy, chlorine and fluorine; and m and l are integers of 0 to 20;
   selectively exposing the layer of the silane coupling reagent to an energy beam so that exposed portions thereof are selectively modified to form patterns of exposed and unexposed portions;
   forming a block copolymer layer comprising first and second block chains on the layer of the silane coupling reagent; and
   causing the block copolymer layer to be phase-separated to form patterns of the first and second block chains of the block copolymer layer based on the patterns of the exposed and unexposed portions of the layer of the silane coupling reagent.

2. The method according to claim 1, further comprising:
   selectively removing the patterns of the first or second block chain; and
   using the remained patterns of the second or first block chain as etching masks.

3. The method according to claim 1, comprising:
   selectively exposing the layer of the silane coupling reagent to an energy beam so that the exposed portions thereof are selectively modified to form line-and-space patterns of exposed and unexposed portions;
   causing the block copolymer layer to be phase-separated to form line-and-space patterns of the first and second block chains of the block copolymer layer with smaller pitches than those of the line-and-space patterns of exposed and unexposed portions of the layer of the silane coupling reagent.

4. The method according to claim 1, wherein silane coupling reagent is 1H,1H,2H,2H-perfluorodecyltriethoxysilane.

* * * * *